United States Patent
Mira et al.

(10) Patent No.: US 10,211,125 B2
(45) Date of Patent: Feb. 19, 2019

(54) CONFIGURABLE MOUNTING HOLE STRUCTURE FOR FLUSH MOUNT INTEGRATION WITH VAPOR CHAMBER FORMING PLATES

(71) Applicant: HEATSCAPE.COM, INC., Morgan Hill, CA (US)

(72) Inventors: Ali Mira, Morgan Hill, CA (US); Yashar Mira, Morgan Hill, CA (US); Michael Mira, Morgan Hill, CA (US)

(73) Assignee: HEATSCAPE.COM, INC., Morgan Hill, CA (US)

( * ) Notice: Subject to any disclaimer, the term of this patent is extended or adjusted under 35 U.S.C. 154(b) by 0 days.

(21) Appl. No.: 15/654,114

(22) Filed: Jul. 19, 2017

(65) Prior Publication Data
US 2019/0027425 A1    Jan. 24, 2019

(51) Int. Cl.
*H01L 23/433*    (2006.01)
*H01L 23/40*    (2006.01)
*F28D 15/02*    (2006.01)

(52) U.S. Cl.
CPC ...... *H01L 23/4334* (2013.01); *F28D 15/0233* (2013.01); *H01L 23/4006* (2013.01);
(Continued)

(58) Field of Classification Search
CPC ..... H01L 23/427; H01L 22/12; H01L 23/473; H01L 23/467; H01L 23/4334;
(Continued)

(56) References Cited

U.S. PATENT DOCUMENTS 3,680,189 A * 8/1972 Noren ............... B21D 53/02
                                                       165/104.26
3,934,643 A * 1/1976 Laing ............... E04B 1/806
                                                       122/366
(Continued)

FOREIGN PATENT DOCUMENTS

DE    1284506 B    12/1968
JP    09133482 A   5/1997
SU    407160 A1    11/1973

OTHER PUBLICATIONS

International Search Report and Written Opinion, dated Dec. 4, 2018, for corresponding International Application PCT/US18/42898, filed Jul. 19, 2018, 9 pages.

*Primary Examiner* — Adam B Dravininkas
(74) *Attorney, Agent, or Firm* — Kilpatrick Townsend & Stockton LLP

(57) ABSTRACT

Various embodiments of the disclosure are directed to vapor chambers with a structure that permits configurable mounting holes. Such vapor chambers may have a top plate with apertures and a bottom plate with apertures. Spacers are inserted into the apertures and disposed between the top plate and the bottom plate. Each spacer may have their own aperture that extends throughout the spacer which acts as the mounting hole in the assembled vapor chamber. The various dimensions of the spacers can be configured and selected in order to accommodate varying dimensions of the apertures in the top plate and the bottom plate. These spacers can be used to provide mounting holes of a desired size and provide additional structure support to the vapor chamber. The spacers also lie flush with the top and bottom plates which increases the surface area of the vapor chamber and improves the mounting of the vapor chamber to other structures.

20 Claims, 6 Drawing Sheets

(52) U.S. Cl.
CPC ............... *H01L 2023/4068* (2013.01); *H01L 2023/4075* (2013.01); *H01L 2023/4087* (2013.01)

(58) Field of Classification Search
CPC ......... H01L 23/4006; H01L 2023/4087; H01L 2023/4068; H01L 2023/4075; F28D 15/0233; F28D 15/046; F28D 15/0275
See application file for complete search history.

(56) References Cited

U.S. PATENT DOCUMENTS

| | | | |
|---|---|---|---|
| 6,302,192 B1 | 10/2001 | Dussinger et al. | |
| 6,802,363 B1 * | 10/2004 | Wang | F28D 15/0233 165/104.21 |
| 6,896,039 B2 | 5/2005 | Dussinger et al. | |
| 7,028,760 B2 | 4/2006 | Dussinger et al. | |
| 7,066,240 B2 | 6/2006 | Dussinger et al. | |
| 7,100,679 B2 | 9/2006 | Dussinger et al. | |
| 7,100,680 B2 | 9/2006 | Dussinger et al. | |
| 7,694,725 B2 * | 4/2010 | Chang | F28D 15/0233 165/104.21 |
| 8,109,321 B2 | 2/2012 | Alousi et al. | |
| 8,875,779 B2 * | 11/2014 | Lien | F28D 15/04 165/104.26 |
| 2002/0023742 A1 * | 2/2002 | Dussinger | F28D 15/0233 165/170 |
| 2004/0069460 A1 * | 4/2004 | Sasaki | F28D 15/0241 165/104.26 |
| 2005/0051307 A1 * | 3/2005 | Dussinger | F28D 15/0233 165/104.26 |
| 2006/0032615 A1 * | 2/2006 | Dussinger | F28D 15/0233 165/104.26 |
| 2010/0188809 A1 * | 7/2010 | Hsu | H01L 23/3672 361/679.47 |
| 2011/0304979 A1 | 12/2011 | Peterson et al. | |
| 2011/0315351 A1 | 12/2011 | Meyer, IV et al. | |
| 2013/0098592 A1 * | 4/2013 | Yang | B21D 53/02 165/185 |
| 2014/0154548 A1 * | 6/2014 | Dillmann | H01M 10/5004 429/120 |
| 2016/0091259 A1 | 3/2016 | Lin | |
| 2017/0092619 A1 | 3/2017 | Refai-Ahmed et al. | |

* cited by examiner

CONFIGURABLE MOUNTING HOLE STRUCTURE FOR FLUSH MOUNT INTEGRATION WITH VAPOR CHAMBER FORMING PLATES

FIELD OF THE INVENTION

The present invention relates to vapor chambers, and more specifically to integrating mounting holes in the structure of a vapor chamber when the components of the vapor chamber can have features with variable dimensions.

BACKGROUND OF THE INVENTION

A vapor chamber is a sealed vessel containing fluid that vaporizes in the vicinity of the hot component. The vapor migrates to a cooler surface of the vapor chamber, where it condenses and returns to the vicinity of the hot component.

Vapor chambers are typically used for their high thermal performance. For example, they can be used to dissipate heat from electronic components (e.g., computer chips capable of generating tremendous amounts of heat) by conducting heat away from the electronic component and towards cooling fins on a heatsink. In order to maintain contact for effective heat transfer, the vapor chamber can be mounted (e.g., to the electronic component and/or heatsink) through the use of mounting screws, which requires the vapor chamber to have mounting holes for receiving the mounting screws.

However, it is not a simple matter of adding mounting holes on the periphery of the vapor chamber (e.g., the mounting holes may need to be as close to the electronic component as possible in order to improve contact), and there are certain challenges associated with integrating mounting holes into the enclosed structure of a vapor chamber. There may be variations in the dimensions of the vapor chamber components that make it difficult to have mounting holes of uniform size. Additionally, vapor chambers are weak structures and may be subject to high compression forces from mounting, so any addition of mounting holes should not further compromise the integrity of the vapor chamber. Finally, the assembled vapor chamber should remain enclosed while providing a maximum surface for thermal contact.

BRIEF SUMMARY OF THE INVENTION

One embodiment of the present application is a vapor chamber that includes a top plate and a bottom plate. The top plate may have an exterior surface, an interior surface, and one or more apertures that extend from the exterior surface to the interior surface. The bottom plate may also have an exterior surface, an interior surface, and one or more apertures that extend from the exterior surface to the interior surface. Each of the apertures may have a determinable shape and size (e.g., a circular hole or opening with a diameter) and the thickness of the top or bottom plate around each of those apertures may also be determinable. The amount of apertures in the bottom plate may equal the amount of apertures in the top plate, and the apertures in the bottom plate may be aligned with the apertures in the top plate.

A spacer can be used with each aligned pair of apertures between the top and bottom plates, with each spacer having a body, a top flange connected to the top of the body, and a bottom flange connected to the bottom of the body. Various dimensions of the spacer can be configured or selected. The top flange can be configured with an outer diameter equal to the diameter of the apertures in the top plate and a height equal to the thickness of the top plate around that apertures. The bottom flange can be configured with an outer diameter equal to the diameter of the corresponding aperture in the bottom plate and a height equal to the thickness of the bottom plate around that aperture. The body of the spacer can be configured with a height equal to the distance between the top plate and the bottom plate when coupled. The spacer may have an aperture that extends through the top flange, body, and bottom flange which acts as a mounting hole in the assembled vapor chamber.

The bottom flange of the spacer can be disposed in the aperture of the bottom plate and the top flange of the spacer can be disposed in the aperture of the top plate when the top plate and bottom plate are coupled together to assemble the vapor chamber. In the assembled vapor chamber, the body of the spacer remains disposed between the top plate and the second plate, and the top flange of the spacer is flush with the top plate while the bottom flange of the spacer is flush with the bottom plate. Thus, the dimensions of each spacer can be configured based on the dimensions and thicknesses of the apertures in the top plate and the bottom plate. The spacers can be used to provide uniformly sized mounting holes of a desired size and provide additional structural support to the vapor chamber. Furthermore, the spacers can be flush with the top plate and bottom plate of the vapor chamber which increases the surface area of the vapor chamber and improves the mounting of the vapor chamber to other structures (e.g., a flush mount).

The disclosure will be readily understood by the following detailed description in conjunction with the accompanying drawings.

DETAILED DESCRIPTION OF THE INVENTION

One embodiment of the present application is a vapor chamber, which can be formed as an assembly of two vapor chamber forming plates (e.g., a top plate and a bottom plate). The top plate and the bottom plate are coupled together in order to create the enclosed space that is characteristic of a vapor chamber. Within this enclosed space may be one or more spacers, which are configured or selected based on the dimensions of the apertures in the top and bottom plates. These spacers may be added to the plates during the assembly process.

Figure 1A:
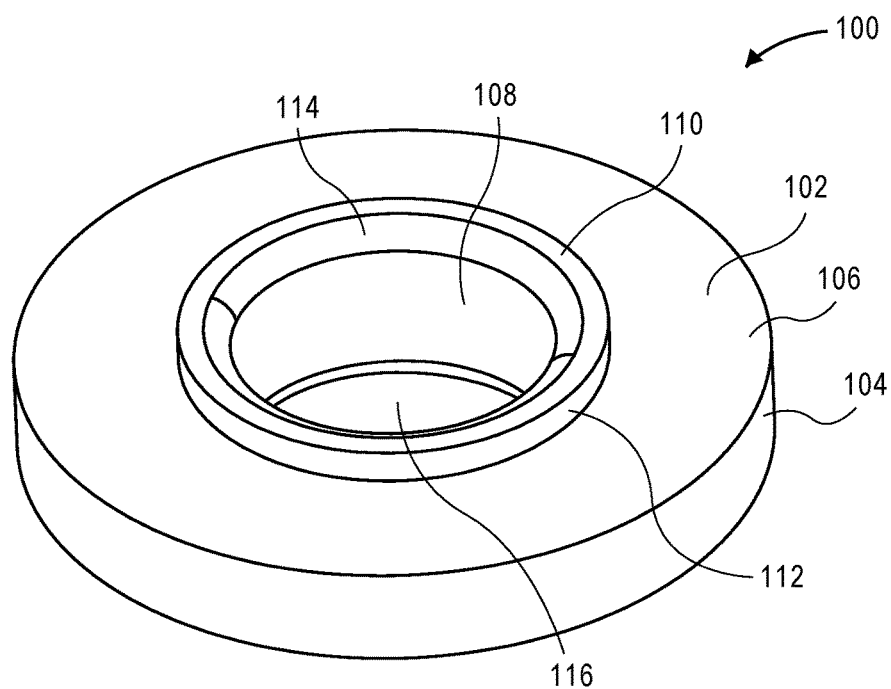
FIG. 1A illustrates a top perspective view of a spacer, in accordance with embodiments of the disclosure.
Figure 1B:
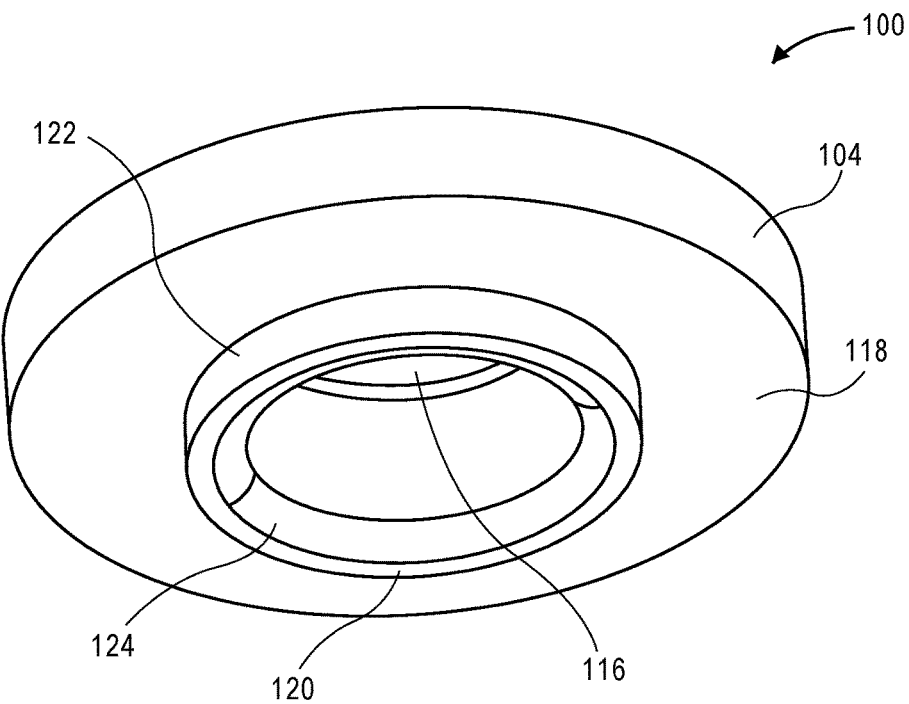
FIG. 1B illustrates a bottom perspective view of a spacer, in accordance with embodiments of the disclosure.

FIG. 1A illustrates a top perspective view of a spacer. FIG. 1B illustrates a bottom perspective view of the spacer. The following description of the spacer is provided in reference to both figures.

In some embodiments, the spacer 100 may have a body 102 with a cylindrical shape, although any suitable shape or configuration can be used (e.g., rectangular, triangular, polygonal, and so forth). The body 102 may have a top surface 106 and a bottom surface 118. The body 102 may have an outer surface 104 having an outer diameter. The body may also have an inner surface 108 having an inner diameter, which is defined by an aperture 116 (e.g., opening) that runs through the spacer 100. Thus, the outer diameter of the outer surface 104 would be greater than the inner diameter of the inner surface 108. The body 102 may also have a height that is additionally defined by the height of the outer surface 104.

In some embodiments, the aperture 116 is cylindrical and configured to receive a shaft of a substantially cylindrical shape (e.g., the shaft of a screw). However, the aperture 116 can be any suitable shape (e.g., rectangular, triangular, polygonal, and so forth) for receiving a shaft of a substantially similar shape as the aperture 116. In some embodiments, the aperture 116 runs through the spacer 100 from the top surface 106 to the bottom surface 118. In some embodiments, the aperture 116 may be normal to both the top surface 106 and the bottom surface 118. In some embodiments, the aperture 116 may be disposed in the center of the body 102.

In some embodiments, the spacer 100 may have a top flange 110 disposed on the top surface 106 of the body 102. In some embodiments, the top flange 110 also has a cylindrical shape. However, the top flange 110 may have any suitable shape (e.g., rectangular, triangular, polygonal, and so forth) that corresponds to the shape of the aperture 116. The top flange 110 may have an outer surface 112 with an outer diameter. The top flange 110 may have a height (e.g., defined by the height of the outer surface 112) which can be selected based on the dimensions of other components of the vapor chamber (not shown).

In some embodiments, the top flange 110 may also have a beveled surface 114. The beveled surface may begin at an inner rim of the top surface of the top flange 110 and end at the top rim of the inner surface 108 of the body 102, which is defined by the aperture 116. In other words, the beveled surface 114 may have a first diameter defined by the top flange 110 (e.g., a diameter of the top surface of the top flange 110) and a second diameter defined by the aperture 116. The aperture 116 may run through both the top flange 110 and the body 102, although the top flange 110 could be alternatively envisioned by itself as having an aperture or cavity that aligns with the aperture in the body 102.

In some embodiments, the spacer 100 may have a bottom flange 120 disposed on the bottom surface 118 of the body 102. In some embodiments, the bottom flange 120 also has a cylindrical shape. However, the bottom flange 120 may have any suitable shape (e.g., rectangular, triangular, polygonal, and so forth) that corresponds to the shape of the aperture 116.

The bottom flange 120 may have an outer surface 122 with an outer diameter. The bottom flange 120 may have a height (e.g., defined by the height of the outer surface 122) which can be selected based on the dimensions of other components of the vapor chamber (not shown).

In some embodiments, the bottom flange 120 may also have a beveled surface 124. The beveled surface may begin at an inner rim of the bottom surface of the bottom flange 120 and end at the bottom rim of the inner surface 108 of the body 102, which is defined by the aperture 116. In other words, the beveled surface 124 may have a first diameter defined by the bottom flange 120 (e.g., a diameter of the bottom surface of the bottom flange 120) and a second diameter defined by the hole 116. The aperture 116 may run through the top flange 110, the bottom flange 120, and the body 102, although the bottom flange 120 could be alternatively envisioned by itself as having a hole or cavity that aligns with the hole in the body 102.

Figure 2:
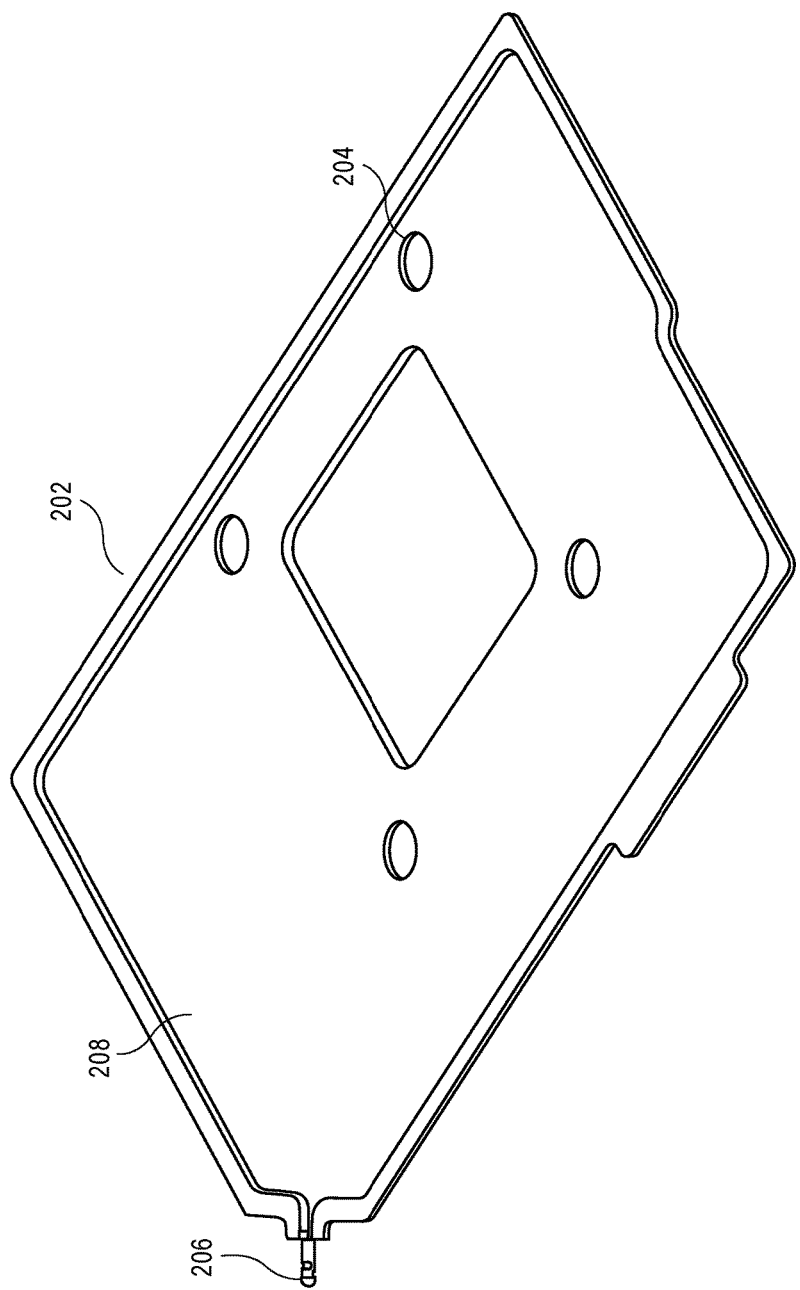
FIG. 2 illustrates a top perspective view of a bottom plate of a vapor chamber, in accordance with embodiments of the disclosure.

FIG. 2 illustrates a top perspective view of a bottom plate of a vapor chamber.

In some embodiments, a vapor chamber may have a top plate (not shown) and a bottom plate 202. The bottom plate 202 may have an interior surface 208 that is enclosed when the top plate and bottom plate 202 are coupled together, as well as an exterior surface (not shown) that is not enclosed when the top plate and bottom plate 202 are coupled. The bottom plate 202 of a vapor chamber may have one or more apertures 204. In some embodiments, the bottom plate 202 may also have a fill port 206.

The bottom plate 202 may have a thickness, which may be defined in some cases by the thickness of the bottom plate 202 surrounding the one or more apertures 204. (in practice, the bottom plate 202 may have recesses, variations in thickness, and so forth, such that there is no uniform thickness for the bottom plate 202—however, the thickness at the one or more apertures 204 is an important dimension for configuring the spacer 100).

Figure 3:
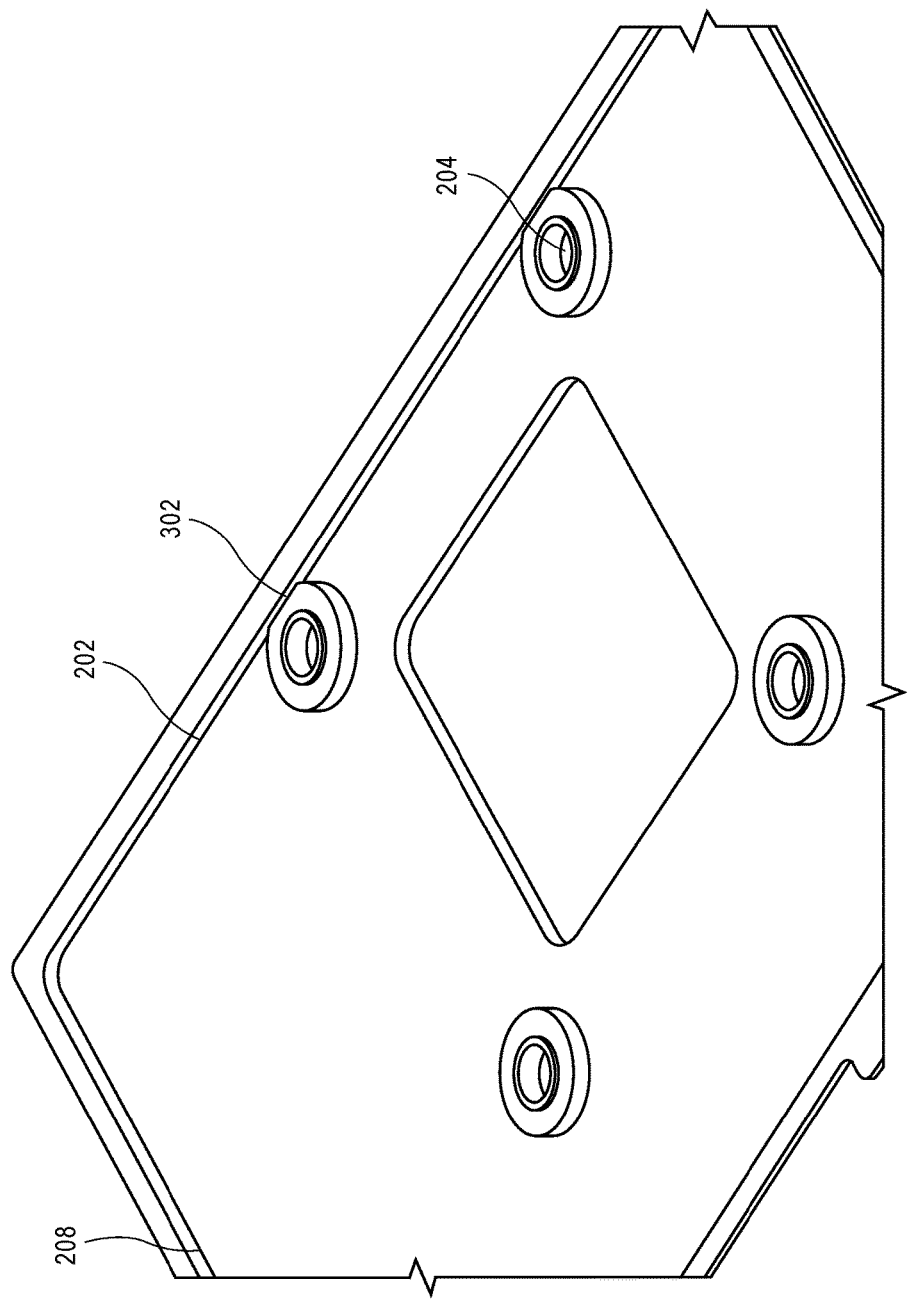
FIG. 3 illustrates a top perspective view of a bottom plate of a vapor chamber with added spacers, in accordance with embodiments of the disclosure.

FIG. 3 illustrates a top perspective view of a bottom plate of a vapor chamber with added spacers.

A bottom plate 202 is shown in which spacers 302 (e.g., like the spacers 100 described in FIGS. 1A and 1B) have been added to each of the apertures 204. The apertures 204 may have a diameter that is equivalent, or roughly equivalent (e.g., within a couple millimeters), to the diameter of the outer surface of the bottom flange of the spacers 302, such that the bottom flange of the spacers 302 can be inserted into the apertures 204 to allow the bottom surface of the body of each of the spacers 302 to lie on the interior surface 208 of the bottom plate 202. In other words, the apertures 204 may have a diameter that is larger than the apertures in the spacers 302.

In some embodiments, the bottom flange of the spacers 302 may have a height that is equivalent, or roughly equivalent (e.g., within a couple millimeters), to the thickness of the bottom plate 202. Thus, once the bottom flanges of the spacers 302 are inserted into the apertures 204, the bottom surfaces of the bottom flanges are flush (e.g., completely level or even) with the exterior surface (not shown) of the bottom plate 202.

Figure 4:
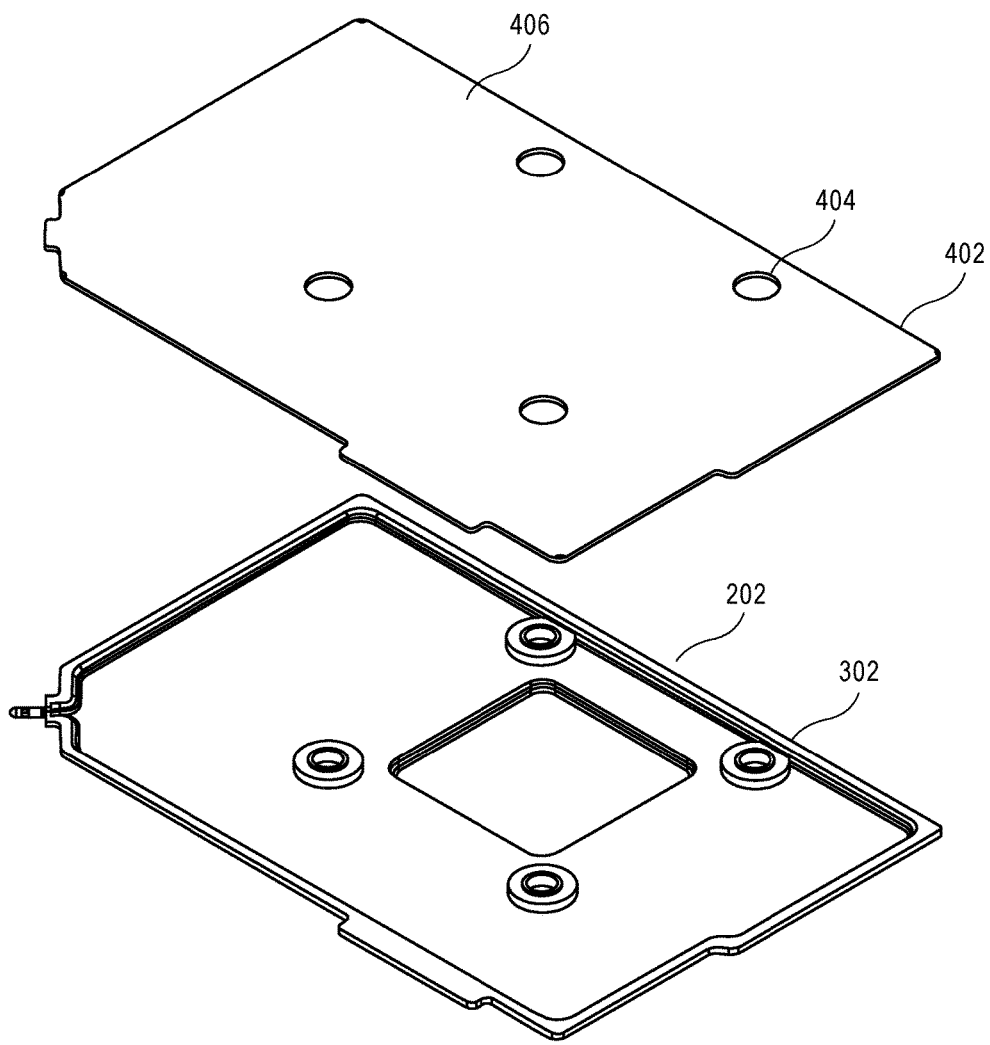
FIG. 4 illustrates a top perspective view of a top plate and a bottom plate of a vapor chamber, in accordance with embodiments of the disclosure.

FIG. 4 illustrates a top perspective view of a top plate and a bottom plate of a vapor chamber.

More specifically, the figure shows a bottom plate 202 with added spacers 302. A top plate 402 of the vapor chamber also shown, with the top plate 402 being complementary to the bottom plate 202. The top plate 402 may have an interior surface (not shown) that is enclosed when the top plate 402 and bottom plate 202 are coupled together, as well as an exterior surface 406 that is not enclosed when the top plate 402 and bottom plate 202 are coupled.

In some embodiments, the top plate 402 may have one or more apertures 404. The top plate 402 may also have a thickness, which may be defined in some cases by the thickness of the top plate 402 surrounding the one or more apertures 404. (although the top plate 402 can have recesses, variations in thickness, and so forth, the thickness of the top plate 402 surrounding the apertures 404 is an important dimension for configuring the spacer 100).

In some embodiments, the apertures 404 in the top plate 402 are aligned with the apertures in the bottom plate 202. Accordingly, when the top plate 402 is coupled to the bottom plate 202, the top flange of the spacers 302 can be inserted into the apertures 404. The apertures 404 may have a diameter that is equivalent, or roughly equivalent (e.g., within a couple millimeters), to the diameter of the outer surface of the top flange of the spacers 302, such that the top flange of the spacers 302 can be inserted into the apertures 404 to allow the top surface of the body of each of the spacers 302 to contact the interior surface of the top plate 202. In other words, the apertures 404 may have a diameter that is larger than the apertures in the spacers 302.

In some embodiments, the top flange of the spacers 302 may have a height that is equivalent, or roughly equivalent (e.g., within a couple millimeters), to the thickness of the top plate 402. Thus, once the top flanges of the spacers 302 are inserted into the apertures 404, the top surfaces of the top flanges are flush with the exterior surface 406 of the top plate 402.

Figure 5:
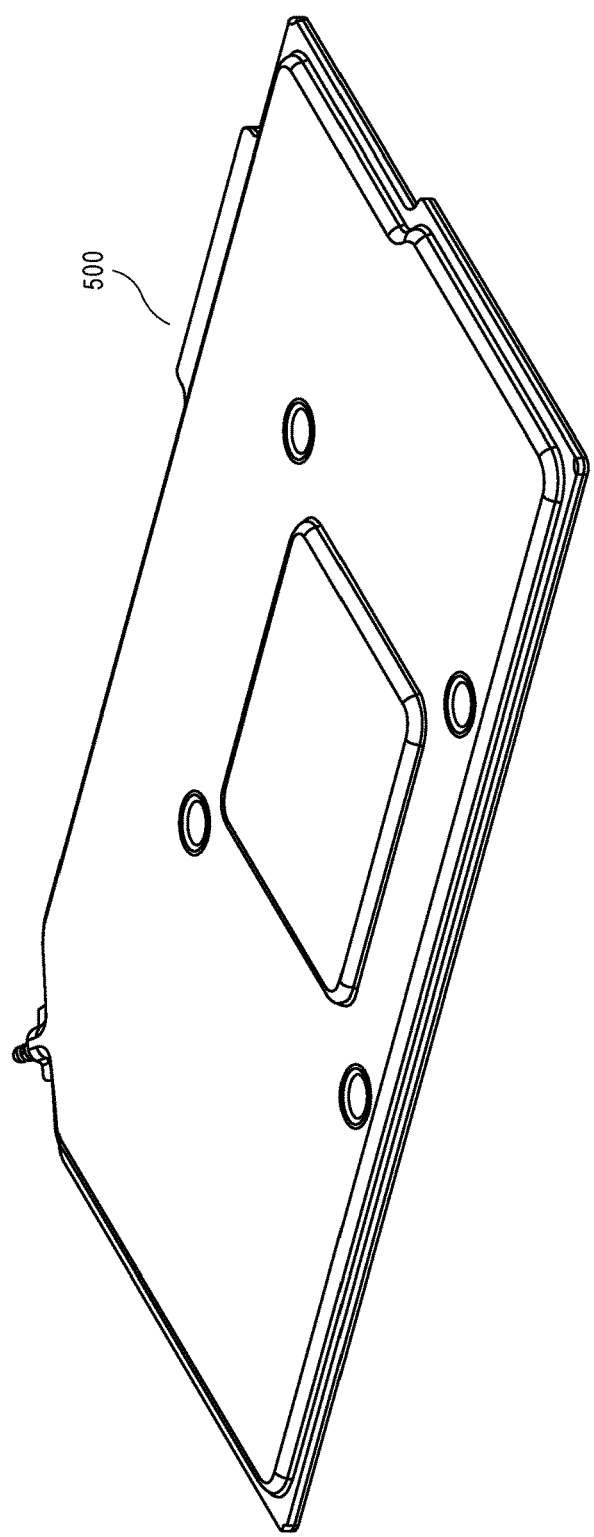
FIG. 5 illustrates a top perspective view of a vapor chamber, in accordance with embodiments of the disclosure.

FIG. 5 illustrates a top perspective view of a vapor chamber, incorporating the spacers described above.

Coupling the top plate 402 and the bottom plate 202 together forms the vapor chamber 500 shown in the figure. The spacers 302 are located between the top plate 402 and bottom plate 202 and are generally not visible, except for the beveled surface of the top flanges, the top surface of the top flanges, the beveled surface of the bottom flanges (not shown), and the bottom surface of the bottom flanges (not shown). However, those spacers are visible in FIG. 6.

Figure 6:
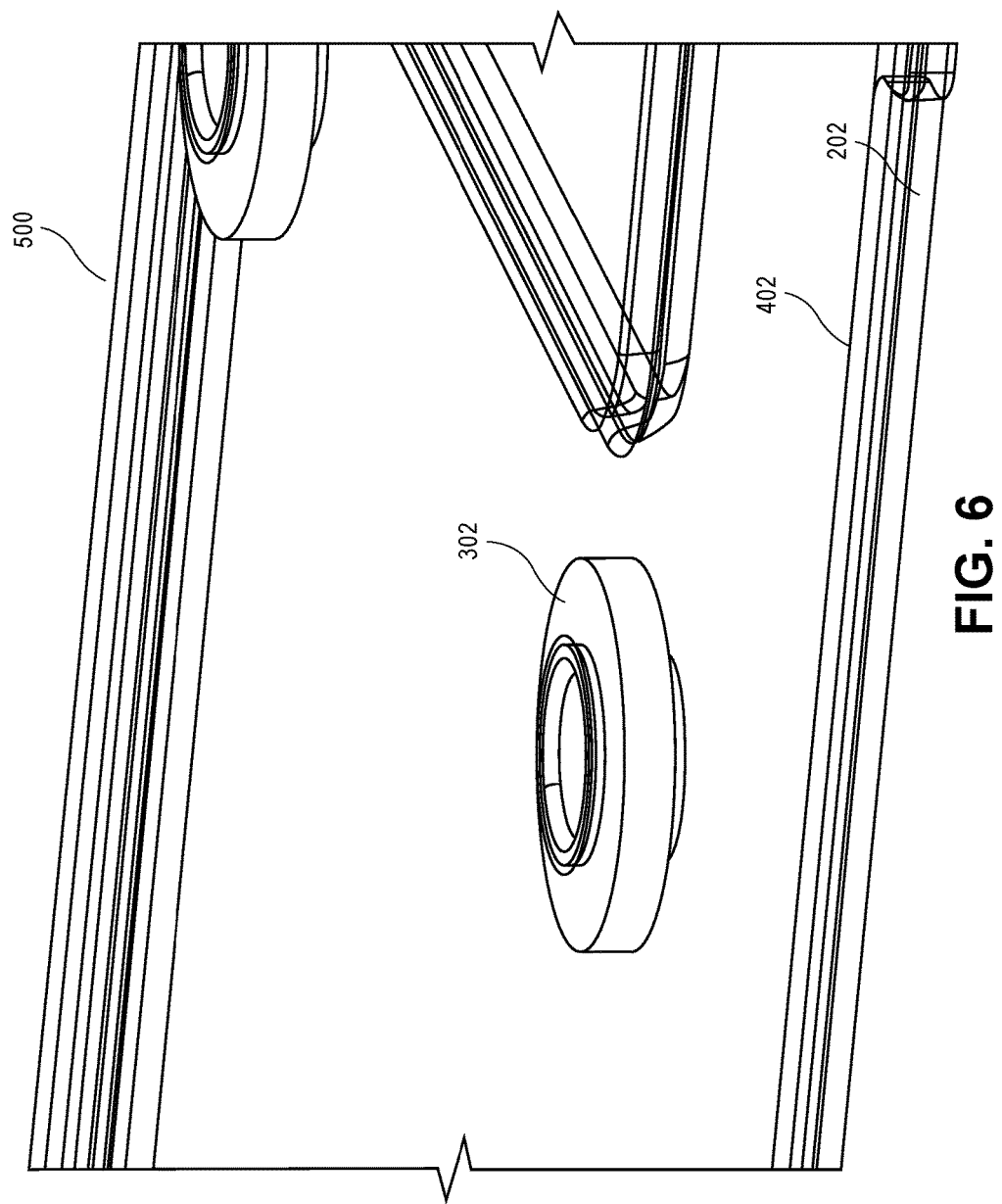
FIG. 6 illustrates a top perspective view of spacers in a vapor chamber, in accordance with embodiments of the disclosure.

FIG. 6 illustrates a top perspective view of spacers in a vapor chamber.

In the figure, the spacers 302 in the vapor chamber 500 are visible through the top plate 402 and the bottom plate 202. As can be seen, the top flange of each of the spacers 302 is flush with the top plate 402; more specifically, the top surface of the top flanges are flush with the exterior surface of the top plate 402. The bottom flange of each of the spacers 302 is flush with the bottom plate 202; more specifically, the bottom surface of the bottom flanges are flush with the exterior surface of the bottom plate 202.

In this configuration, the apertures in the spacers 302 serve as the mounting holes for the vapor chamber 500, which can be used to receive a structure (e.g., shaft or screw) that allows the vapor chamber 500 to be coupled or mounted to other components. This allows mounting holes to be integrated into the vapor chamber 500 without pinching the plates of the vapor chamber 500 together. This increases the contact surface of the vapor chamber 500 (e.g. with the electronic component or heatsink) Additionally, since the spacers 302 are flush with the plates of the vapor chamber 500, there is no interference with the ability to couple or mount the vapor chamber 500 to other components (e.g., a heatsink). Furthermore, the spacers 302 also provide a small amount of additional structural support to the vapor chamber 500 since the body of each spacer is seated between the top plate 402 and the bottom plate 202.

Thus, the spacers 302 serve as a configurable mounting hole structure and its dimensions can be tailored/configured based on the dimensions of the plates of the vapor chamber 500, in order to provide the desired mounting hole diameter while keeping the spacers 302 flush with the plates of the vapor chamber 500. The spacers 302 can also be used to correct any differences in aperture diameters between/across the plates of the vapor chamber 500 and correct any variations in thickness present in the plates of the vapor chamber 500.

For example, the height of the top flange of each spacer can be configured based on the thickness of the top plate (at the location of the top plate that spacer is to be added) in order for that spacer to be flush with the top plate in the assembled vapor chamber. Similarly, the height of the bottom flange of each spacer can be configured based on the thickness of the bottom plate (at the location of the bottom plate that spacer is to be added) in order for that spacer to be flush with the bottom plate in the assembled vapor chamber.

The height of the body of each spacer (e.g., the thickness) can be configured based on the distance between the top plate and the bottom plate (at the location for which the spacer is to be added) in the assembled vapor chamber, which can be helpful if the distance between the plates varies throughout the vapor chamber.

The outer diameter of the top flange of each spacer can be configured based on the diameter of the aperture in the top plate (at the location that spacer is to be added). For instance, a top plate could have apertures of varying sizes and different spacers (with varying top flange outer diameters) could be used with those apertures in order to provide a uniform size for the mounting holes. Similarly, the outer diameter of the bottom flange of each spacer can be configured based on the diameter of the aperture in the bottom plate (at the location that spacer is to be added).

Finally, the diameter of the aperture in the spacers can be selected based on the desired mounting hole size for the assembled vapor chamber, and the beveled surface and thickness of the top flange and bottom flanges can be selected in order to "bridge" the diameter of an aperture in a plate down to the desired mounting hole size. For example, a top plate could have an aperture with a very large diameter while the desired mounting hole size is a much smaller diameter. For that aperture, a spacer could be installed with a top flange having an outer diameter equal to the diameter of that large aperture and a large thickness—effectively converting the large aperture into a much narrower one defined by the aperture in the spacer.

In some embodiments, a vapor chamber can be manufactured or assembled by first determining the dimensions of a top plate (e.g., plate thickness and aperture diameters) and the dimensions of a bottom plate. Alternatively, a top plate and/or bottom plate can be manufactured with the desired dimensions. Once the dimensions of the top plate and bottom plate are known, spacers can be configured, manufactured, or selected to specifically fit into the apertures of the top plate and the bottom plate, such that each spacer is flush with the top plate and the bottom plate of the assembled vapor chamber and such that the assembled vapor chamber has mounting holes with a desired size (e.g., the diameter of the apertures in the spacers). The vapor chamber can be assembled by placing those spacers over the apertures of the top plate and/or the bottom plate and coupling the top and bottom plates.

In some embodiments, the spacer may be made of a different material as that of the top plate and the bottom plate, while in other embodiments, the spacer may be made of the same material as that of the top plate and the bottom plate. In some embodiments, the top plate and the bottom plate are made of copper and the spacer is made of copper as well. In some embodiments, the spacer may be of a unitary construction, such that the top flange, body, and bottom flange of the spacer are of a single unit.

Thus, the embodiments of the vapor chamber described herein utilized spacers with dimensions that are configured based on the size of the apertures in the top and bottom plates and the dimensions of the top and bottom plates. Alternatively, the size of the apertures in the top and bottom plates and the dimensions of the top and bottom plates can be configured based on the dimensions of the spacers. In either case, the body of the spacers have a height equal to the distance between the top plate and the bottom plate when coupled, which allows the apertures in the spacers to provide uniformly sized mounting holes of a desired size in the assembled vapor chamber. Furthermore, the tight fit between the spacers and the top and bottom plates allow the spacers to provide additional structural support to the vapor chamber, and the spacers are flush with the plates which improves the mounting of the vapor chamber to other structures.

Terminology

The terms "approximately", "about", and "substantially" as used herein represent an amount close to the stated amount that still performs a desired function or achieves a desired result. For example, the terms "approximately", "about", and "substantially" may refer to an amount that is within less than 10% of, within less than 5% of, within less than 1% of, within less than 0.1% of, and within less than 0.01% of the stated amount.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above.

Similarly, this method of disclosure is not to be interpreted as reflecting an intention that any claim require more features than are expressly recited in that claim. Rather, inventive aspects may lie in a combination of fewer than all features of any single foregoing disclosed embodiment. Thus, the claims following the Detailed Description are hereby expressly incorporated into this Detailed Description, with each claim standing on its own as a separate embodiment.

What is claimed is:

1. A vapor chamber, comprising:
a top plate, the top plate comprising:
an exterior surface of the top plate;
an interior surface of the top plate, wherein the interior surface of the top plate is enclosed;
a first aperture having a first diameter, wherein the first aperture extends from the exterior surface of the top plate to the interior surface of the top plate;
a thickness of the top plate around the first aperture;
a bottom plate, the bottom plate comprising:
an exterior surface of the bottom plate;
an interior surface of the bottom plate, wherein the interior surface of the bottom plate is enclosed;
a second aperture having a second diameter, wherein the second aperture extends from the exterior surface of the bottom plate to the interior surface of the bottom plate;
a thickness of the bottom plate around the second aperture; and
a spacer comprising:
a body disposed between the top plate and the bottom plate, wherein the body has a height equal to a distance between the top plate and the bottom plate;
a top flange connected to the top of the body and disposed within the first aperture, wherein the top flange has an outer diameter equal to the first diameter, wherein the top flange has a height equal to the thickness of the top plate around the first aperture such that the top flange is flush with the top plate;
a bottom flange connected to the bottom of the body and disposed within the second aperture, wherein the bottom flange has an outer diameter equal to the second diameter, and wherein the bottom flange has a height equal to the thickness of the bottom plate around the second aperture such that the bottom flange is flush with the bottom plate,
wherein the top and bottom flanges comprise beveled surfaces; and
a mounting hole that extends through the top flange, the body, and the bottom flange.

2. The vapor chamber of claim 1, wherein the first aperture is circular, and wherein the second aperture is circular.

3. The vapor chamber of claim 1, wherein the mounting hole is circular.

4. The vapor chamber of claim 1, wherein the body of the spacer is cylindrical.

5. The vapor chamber of claim 1, wherein the spacer has a unitary construction.

6. The vapor chamber of claim 1, wherein the spacer is made of a material different from that of the top plate or the bottom plate.

7. The vapor chamber of claim 1, wherein the spacer is made of a material same as that of the top plate or the bottom plate.

8. The vapor chamber of claim 1, wherein the spacer is made of copper.

9. The vapor chamber of claim 1, wherein the mounting hole has a uniform diameter.

10. The vapor chamber of claim 1, wherein the mounting hole is configured with a diameter for receiving a mounting screw.

11. A method for assembling a vapor chamber, wherein the method comprises:
determining a first diameter of a first aperture in a top plate, wherein the top plate comprises:
an exterior surface of the top plate;
an interior surface of the top plate,
wherein the first aperture extends from the exterior surface of the top plate to the interior surface of the top plate;
determining a thickness of the top plate around the first aperture;
determining a second diameter of a second aperture in a bottom plate, wherein the bottom plate comprises:
an exterior surface of the bottom plate;

an interior surface of the bottom plate,
wherein the second aperture extends from the exterior surface of the bottom plate to the interior surface of the bottom plate;
determining a thickness of the bottom plate around the second aperture;
determining a distance between the top plate and the bottom plate when coupled;
selecting a spacer, wherein the spacer comprises:
a body having a height equal to the distance between the top plate and the bottom plate when coupled;
a top flange connected to the top of the body, wherein the top flange has an outer diameter equal to the first diameter, and wherein the top flange has a height equal to the thickness of the top plate around the first aperture;
a bottom flange connected to the bottom of the body, wherein the bottom flange has an outer diameter equal to the second diameter, and wherein the bottom flange has a height equal to the thickness of the bottom plate around the second aperture,
wherein the top and bottom flanges comprise beveled surfaces; and
a mounting hole that extends through the top flange, the body, and the bottom flange;
inserting the bottom flange of the spacer into the second aperture of the bottom plate;
inserting the top flange of the spacer into the first aperture of the top plate;
coupling the top plate and the bottom plate; and
permitting the top flange of the spacer to be flush with the top plate and the bottom flange of the spacer to be flush with the bottom plate.

12. The method of claim 11, wherein the first aperture is circular, and wherein the second aperture is circular.

13. The method of claim 11, wherein the mounting hole is circular.

14. The method of claim 11, wherein the body of the spacer is cylindrical.

15. The method of claim 11, wherein the spacer has a unitary construction.

16. The method of claim 11, wherein the spacer is made of a material different from that of the top plate or the bottom plate.

17. The method of claim 11, wherein the spacer is made of a material same as that of the top plate or the bottom plate.

18. The method of claim 11, wherein the spacer is made of copper.

19. The method of claim 11, wherein the mounting hole has a uniform diameter.

20. The method of claim 11, wherein the mounting hole is configured with a diameter for receiving a mounting screw.

* * * * *